United States Patent [19]

Chiulli

[11] Patent Number: 5,137,844
[45] Date of Patent: Aug. 11, 1992

[54] PROCESS TO ADJUST OUTPUT OF LIGHT EMITTERS

[75] Inventor: Carl A. Chiulli, Randolph, Mass.

[73] Assignee: Polaroid Corporation, Cambridge, Mass.

[21] Appl. No.: 681,146

[22] Filed: Apr. 5, 1991

[51] Int. Cl.$^5$ .................. H01L 21/20; H01L 21/268
[52] U.S. Cl. .................. 437/129; 437/127; 437/173; 437/905; 148/DIG. 99; 148/DIG. 93
[58] Field of Search ............ 437/129, 127, 173, 905; 148/DIG. 99, DIG. 93

[56] References Cited

U.S. PATENT DOCUMENTS

| | | | |
|---|---|---|---|
| 3,650,796 | 3/1972 | Jackson et al. | 117/8 |
| 3,843,401 | 10/1974 | Carroll | 117/227 |
| 3,996,526 | 12/1976 | d'Auria et al. | 331/94.5 S |
| 4,280,107 | 7/1981 | Scifres et al. | 331/94.5 H |
| 4,738,869 | 4/1988 | Baumgartner | 437/173 |
| 4,840,922 | 6/1989 | Kobayashi et al. | 437/129 |
| 4,878,222 | 10/1989 | Lawrence | 372/48 |
| 4,927,778 | 5/1990 | Abbas | 437/51 |
| 4,956,684 | 9/1990 | Urata | 357/17 |
| 4,980,700 | 12/1990 | Yess | 346/1.1 |
| 4,983,546 | 1/1991 | Hyun et al. | 437/173 |

*Primary Examiner*—Brian E. Hearn
*Assistant Examiner*—Linda J. Fleck
*Attorney, Agent, or Firm*—David J. Cole

[57] ABSTRACT

The electromagnetic radiation output from a solid-state radiation emitter is adjusted by covering at least part of the emission surface with an absorber material which absorbs the radiation emitted from the emitter, and directing a beam of radiation from outside the radiation emitter on to the absorber material so as to ablate at least part of the absorber material from the emission surface, or render at least part of the absorber material transmissive of the electromagnetic radiation from the emitter. The process is especially useful for equalizing the outputs from an array of emitters, such as a bar of light emitting diodes.

12 Claims, No Drawings

PROCESS TO ADJUST OUTPUT OF LIGHT EMITTERS

BACKGROUND OF THE INVENTION

This invention relates to a process for adjusting the electromagnetic radiation output from a solid-state radiation emitter.

Light emitting diodes (LED's), and similar devices such as liquid crystal shutters, are used, inter alia, to print on light-sensitive media such as photographic film, thermal imaging media such as those described in International Patent Application No. PCT/US87/03249 (International Publication Number WO 88/04237), and photoconductive receptors used in electrophotography. Typically, the LED's are provided in a long linear array.

To secure a high quality image, it is important that all the LED's have the same output under the same drive current and other conditions, since even small variations in output among the LED's may produce noticeable dark or light lines across the printed image. Unfortunately, the present state of technology does not allow for the fabrication of large LED arrays with sufficiently uniform output from each diode for imaging purposes, while still maintaining an acceptable yield of arrays from the semiconductor wafers on which the LED's are fabricated. Accordingly, various techniques have been devised to "correct" the output from the LED's as fabricated in order to provide an array of LED's with the uniform output required for imaging.

For example, according to U.S. Pat. No. 4,927,778 to Abbas, one of the major causes of non-uniformity in LED arrays as fabricated is the presence of parallel linear crystal defects in the wafer, which defects result in the production of dark line defects in the completed diodes. To deal with these dark line defects, this patent proposes examining each semiconductor wafer in advance of formation of diode arrays thereon to determine the nature and alignment of the parallel linear crystal irregularities, forming the diode arrays on the semiconductor wafer with their major axes parallel to the linear crystal irregularities, and subdividing the wafer to produce a plurality of chips each containing at least one of the diode arrays. This process requires detailed examination of each wafer prior to fabrication, and does not allow correction of point defects in the wafer which are not due to linear crystal defects.

Electronic techniques have also been used to secure uniform output from LED arrays. Such techniques rely upon adjusting the potential difference or drive current to each individual LED in accordance with a prior measurement of the variation of the output of each individual LED with the parameter being adjusted. For example, U.S. Pat. No. 4,878,222 to Lawrence describes a method of electrically modulating the light intensity emitted from semiconductor diode lasers by means of low voltage, low current modulating control bias signals. Also, U.S. Pat. No. 3,996,526 to d'Auria et al. describes an electronic method for controlling the output of an LED, in which a photodiode is located close to the radiating surface of the LED for picking off a part of the optical radiation and for delivering a feedback current which is used in a current negative feedback loop. However, such electronic output control techniques require the provision of a separate control circuit for each emitter, and thus add greatly to the cost of complexity of multiple emitter devices, especially since LED arrays used in practice may contain from several dozen to several hundred individual LED's. In addition, such electronic techniques degrade the grey-scaling factors used to determine the desired output from each LED, and may thus adversely affect image quality when the image has a large number of grey levels, for example 64 or 256.

It is also known to apply coatings to the emitting surfaces of LED's for various purposes. For example, U.S. Pat. No. 4,840,922 to Kobayashi et al. describes a masked semiconductor laser which produces a very narrow beam intended for use in writing optical disks and similar applications. A masking layer is deposited over the light-emitting surface of the laser and then the laser is driven at high power to "burn" a small central aperture through the masking layer.

Similarly, U.S. Pat. No. 4,280,107 to Scifres et al. describes apertured and unapertured reflector structures for LED's and semiconductor lasers. These structures comprise, outwardly from the LED or laser, a layer of low refractive index, a layer of intermediate refractive index and a layer of high refractive index. Ablative means remove and form an aperture in the outer high index layer at the region of optical radiation emission from the device so that the level of reflectivity is highest at the center of the aperture, so that fundamental mode stabilization may be achieved.

U.S. Pat. No. 3,843,401 to Carroll describes a masking technique for semiconductor lasers which is somewhat similar to that described in the aforementioned U.S. Pat. No. 4,280,107. In Pat. No. 3,843,401, an anti-reflection coating is applied to the emitting face of a semi-conductor laser and a film of bismuth is applied over the anti-reflection coating. The laser is then pulsed at high power, and light absorbed by the bismuth causes an aperture to be formed in the bismuth layer over the active region of the laser.

There is thus a need for a simple process for adjusting the output of electromagnetic radiation from an emitter which does not require the provision of additional electronics and which can readily be applied to ensure that the outputs from a plurality of emitters in an array are substantially equal to one another, or differ from one another in accordance with a predetermined pattern. This invention provides such a process.

SUMMARY OF THE INVENTION

This invention provides a process for adjusting the electromagnetic radiation output from a solid-state radiation emitter having an emission surface through which the radiation leaves the device. This process comprises covering at least part of the emission surface with an absorber material which absorbs the radiation emitted from the emitter, and directing a beam of radiation from outside the radiation emitter on to the absorber material so as to ablate at least part of the absorber material from the emission surface, or render at least part of the absorber material transmissive of the electromagnetic radiation from the emitter.

DETAILED DESCRIPTION OF THE INVENTION

As already mentioned, this invention provides a process for adjusting the electromagnetic radiation output (hereinafter referred to as the "emitter output") from an emitter. The term "emitter" is used herein to mean not only devices which themselves generate electromagnetic radiation (for example, light emitting diodes and semi-conductor lasers), but also devices (such as liquid crystal cells and lead lanthanum zirconate titanate light valves, which transmit electromagnetic radiation originating from another source. It will be apparent from the present process will operate with equal effectiveness whether the radiation emerging from the emission surface is generated within the emitter itself or is generated elsewhere and passed through the emitter to its emission surface.

Since the present invention is applicable to emitters of both visible and non-visible radiation, terms such as "clear", "cloudy", "transparent" and the like are to be construed as referring to transmission or absorption of radiation of the wavelength leaving the emission surface, not necessarily to visible radiation. For example, many materials which are highly absorbent in the near infra-red are almost transparent to visible radiation.

In the present process, a beam (hereinafter referred to as the "external beam") of radiation from outside the radiation emitter is directed on to the absorber material so as to ablate at least part of the absorber material from the emission surface, or render at least part of the absorber material transmissive of the electromagnetic radiation from the emitter. The exact nature of the change in the absorber material effected by the external beam is not critical, provided that the absorber material is changed from a condition in which it absorbs emitter radiation to a condition in which it is at least partially transparent to this radiation. For example, the absorber material could be a liquid crystal polymer which is cloudy as originally applied to the emission surface but which becomes clear when heated and/or melted by the external beam. However, in general it is preferred that the external beam simply ablate the absorber material from the emission surface, either by vaporizing the absorber material, or by fracturing it into small particles which are blown away from the emission surface by the external beam.

Although the process of the present invention can be used to adjust the output from a single emitter, it is especially intended for use in a process wherein a plurality of solid-state emitters are disposed adjacent one another and the beam of radiation is applied to remove selectively the absorber material in a predetermined manner, this removal being effected from areas of absorber material overlying respective ones of the light emitters and being sufficient to permit predetermined transmission through the removed areas so as to provide a predetermined level of emission from each of the radiation emitters. In most cases, such a process will be used to ensure that the outputs of the light emitters become substantially equal to one another. Typically, the present process will be used to adjust the outputs of a plurality of solid-state emitters disposed in a linear array (for example the LED bars used in some imaging systems) or a rectilinear array.

Although a wide variety of absorber materials may be used in the present process, a preferred absorber is carbon black, which can be applied conveniently and gives very satisfactory ablation with a laser beam. The carbon black is conveniently applied using the so-called "dry erase markers", which are available commercially and which comprise carbon black particles in a weak binder. One example of such a marker is that sold under the tradename "EXPO Dry Erase" by Sanford Corporation, Bellwood IL 60104. Alternatively, the absorber may be applied using a solvent-based marker; such markers contain a solution of an organic dye in a solvent. Examples of such markers are those sold under the tradename "Sharpie" by the aforementioned Sanford Corporation.

The absorber material may be applied to part or all of the emission surface of each emitter. Although the variations in output between the LED's in an LED bar are typically around 10–20 percent, and thus in theory it is only necessary to cover about 20 percent of each emission surface to allow for equalization of outputs from the LED's using the present process, in practice the small size of the LED's (which are typically only about 100 $\mu$m square) renders it very difficult to adopt such a technique, and it is usually more convenient to cover all or substantially all of the emission surface of each emitter with the absorber material, and then to ablate, or otherwise change, the requisite amount of absorber material on each emission surface. Furthermore, using this method it is not necessary to measure the output of each individual emitter before carrying out the adjustment process; one can simply monitor the output from each emitter as the absorber is removed and cease the removal when the emitter shows the desired output. Such monitoring may be effected by removing one or more areas of absorber material from the emission surface with one or a plurality of pulses of the external beam, then measuring the output from the emitter, removing one or more additional areas of absorber material, remeasuring the output from the emitter, and continuing this procedure until the emitter output reaches the desired level. Alternatively, if the external beam has a wavelength different from the emitter radiation, the emitter may be operated continuously as the external beam is being applied, the emitter output monitored, and the application of the external beam ended when the emitter output reaches the desired value.

The external beam used to remove the absorber is preferably a laser beam, which can readily be focussed, using conventional optical systems, down to a spot size of about 10 $\mu$m diameter. Use of a spot of this size permits about 100 discrete spots to be placed upon a typical LED, and even if control of the laser is limited so that the absorber material on a given spot can only be completely present or completely removed, provision of this number of spots enables the output of the emitters to be adjusted within ± 1 percent, which is adequate for many imaging applications. In fact, conventional optical systems can readily be constructed to move a focussed laser beam in steps of about 2 $\mu$m, thus permitting a much finer degree of control of emitter output.

Obviously, the removal of the absorber material must be effected in a manner which does not significantly damage the emitter. In at least some cases, it is desirable that the laser beam have a wavelength different from that of the emitter radiation. When it is desired to remove a carbon black absorber from an LED array, an Nd-YAG laser has been found to be capable of removing the carbon black without measurable damage to the LED's. In addition, it is important to control closely the depth of focussing of the laser beam in order that the focal point is located accurately in the plane of the absorber and not within the LED.

It is well-known that the outputs of LED's change significantly as the LED "ages" over its working lifetime; the output not only decreases in intensity with time but also shifts to longer wavelengths. In practice it has been found that the outputs of individual LED's in an array change at essentially the same rate as the LED's age; thus, once the outputs of the LED's in such an array have once been equalized by the present process, those outputs will remain substantially equal notwithstanding that the absolute output of each LED decreases with age. However, if desired, when adjusting the outputs of the LED's in such an array by the present process, a proportion of each emission surface may be left covered with the absorber material so that, should be outputs of the LED's become unequal as the LED's age, their outputs may be readjusted by further removal of the absorber material.

From the foregoing, it will be seen that the present invention provides a convenient and economical process for adjusting the electromagnetic radiation output from a solid-state radiation emitter which does not require the provision of auxiliary circuitry and which can readily be applied to equalize the outputs from large arrays of emitters.

The following Example is now given, though by way of illustration only, to show details of particularly preferred reagents, conditions and techniques used in the present process.

An LED bar approximately 25 mm long and containing 80 individual LED's each having an emission surface approximately 100 μm square was used in this experiment. The outputs of the various LED's were measured and found by vary over a range of about 15 to 20%. All the emission surfaces of the LED's were then covered with carbon black using an EXPO dry erase marker, which contained carbon black in a weak binder. The carbon black was then ablated from each emission surface using a Nd-YAG laser focussed to a spot size of approximately 10 μm diameter, with the output from the LED being treated being monitored at frequent intervals between pulses from the laser. After all the LED's had been treated, it was found that their outputs varied by less than ± 2 percent.

We claim:

1. A process for adjusting the electromagnetic radiation output from at least one solid-state radiation emitter having an emission surface through which the radiation leaves the device, the process comprising covering at least part of the emission surface with an absorber material which absorbs the radiation emitted from the emitter, and directing a beam of radiation from outside the radiation emitter on to the absorber material so as to ablate at least part of the absorber material from the emission surface.

2. A process according to claim 1 wherein a plurality of solid-state emitters are disposed adjacent one another and the beam of radiation is applied to ablate selectively the absorber material in a predetermined manner, this ablation being effected from areas of absorber material overlying respective ones of the light emitters and being sufficient to permit predetermined transmission through the ablated areas so as to provide a predetermined level of emission from each of the radiation emitters.

3. A process according to claim 2 wherein the ablation of the absorber material is continued until the outputs of each of the radiation emitters are substantially equal to one another.

4. A process according to claim 3 wherein the plurality of solid-state emitters are disposed in a linear or rectilinear array.

5. A process according to claim 3 wherein the solid-state emitters are light-emitting diodes or semi-conductor lasers.

6. A process according to claim 3 wherein the light-emitters are liquid crystal or lead lanthanum zirconate titanate light valves.

7. A process according to claim 3 wherein the absorber material comprises carbon black.

8. A process according to claim 3 wherein the ablation of the absorber material is effected by a laser beam.

9. A process according to claim 8 wherein the laser beam has a wavelength different from that of the radiation emitted by the radiation emitters.

10. A process according to claim 1 wherein the ablation of the absorber material is effected by
   a. ablating one or more areas of absorber material from the emission surface with one or a plurality of pulses of the external beam;
   b. thereafter measuring the output from the emitter; and
   c. repeating steps a. and b. until the emitter output reaches the desired level.

11. A process according to claim 1 wherein the external beam has a wavelength different from the emitter radiation, and during the ablation of the absorber material the emitter is operated continuously as the external beam is being applied, the emitter output monitored, and the application of the external beam ended when the emitter output reaches the desired value.

12. A process for adjusting the electromagnetic radiation output from an array of emitters comprising light-emitting diodes or semi-conductor lasers each emitter in the array having an emission surface through which the radiation leaves the emitter, the process comprising covering at least part of the emission surface of a plurality of the emitters in the array with an absorber material which absorbs the radiation emitted from the emitters, and ablating at least part of the absorber material from the emission surface of each emitter by directing a beam of radiation from outside the array on to the absorber material, the ablation being carried out until the outputs of each of the radiation emitters to which the absorber material has been applied are substantially equal to one another.

* * * * *